United States Patent [19]

Spicer

[11] Patent Number: 4,801,879
[45] Date of Patent: Jan. 31, 1989

[54] ELECTRON BEAM TESTING OF INTEGRATED CIRCUITS

[75] Inventor: Denis F. Spicer, Bedford, England
[73] Assignee: Texas Instruments Incorporated, Dallas, Tex.
[21] Appl. No.: 142,292
[22] Filed: Jan. 4, 1988

Related U.S. Application Data

[63] Continuation of Ser. No. 872,567, Jun. 10, 1986.

[30] Foreign Application Priority Data

Jun. 17, 1985 [GB] United Kingdom ............... 8515250

[51] Int. Cl.⁴ ...................... G01N 23/00; G01R 31/28
[52] U.S. Cl. ........................... 324/158 R; 324/158 D; 324/73 R; 250/310; 250/311
[58] Field of Search ............ 324/158 R, 158 D, 73 R, 324/71.3; 250/310, 307, 311, 492.1

[56] References Cited

U.S. PATENT DOCUMENTS

| | | | |
|---|---|---|---|
| 4,539,477 | 9/1985 | Feuerbaum et al. | 324/158 R |
| 4,658,137 | 4/1987 | Garth et al. | 250/310 X |
| 4,721,855 | 1/1988 | Fazekas | 324/158 R X |
| 4,721,910 | 1/1988 | Bokor et al. | 324/158 D X |

FOREIGN PATENT DOCUMENTS 1293716 10/1972 United Kingdom.
2021789 12/1979 United Kingdom.

OTHER PUBLICATIONS

Feuerbaum; "VLSI Testing Using Electron Probe"; Scanning Electron Microscopy.

Primary Examiner—Reinhard J. Eisenzopf
Assistant Examiner—Vinh P. Nguyen
Attorney, Agent, or Firm—N. Rhys Merrett; Melvin Sharp; Gary C. Honeycutt

[57] ABSTRACT

An apparatus and a method for monitoring the functioning of an integrated circuit in operation using an electron beam directed to a particular node of the circuit which is of interest and measuring the energy of the secondary electrons emitted, in which the energy measurement is made using a filter grid, the bias on which is set by comparing a voltage representing the rate of receipt of secondary electrons past the filter grid with a reference voltage and adjusting the bias in response to the comparison so as to reduce the number of electrons received. A current is produced proportional to the difference between the two voltages and applied to charge a capacitor, the voltage on which is used to set the voltage on the filter grid. The electron beam may be pulsed and the comparison gated in synchronism with the pulsing but delayed relative to it so that the control of the filter grid bias is effected only when the signal due to the secondary electrons emitted in response to the beam pulse is received by the comparator.

17 Claims, 4 Drawing Sheets

ELECTRON BEAM TESTING OF INTEGRATED CIRCUITS

This application is a Continuation of application Ser. No. 872,567, filed June 10, 1986.

This invention relates to the testing of integrated circuits using an electron beam.

A difficulty encountered in testing an integrated circuit is that the only outputs which can be monitored by conventional means such as meters and oscilloscopes are those on the output conductors of the circuit because the internal conductors are very small and are also inaccessible under insulating coatings and the currents flowing may be extremely small. It has been found that when an electron beam is directed at a node of an integrated circuit in operation the energies of secondary electrons emitted from the integrated circuit are dependent on the potential of the node of the circuit being bombarded and such bombardment does not impose loads on the circuit sufficient to interfere with its operation. Use has been made of this property to derive indications of the potentials at various places on the circuit to assess its performance. A critical factor in the accurate measurement of the electron energies and therefore of the circuit potentials is the setting of the potential on a filter grid in the secondary electron detector, which determines the minimum energy level of the electrons detected and to achieve this the potential is set by means of a feedback loop from the number of electrons passing the filter grid. In practice the accuracy with which the filter grid potential is set is limited by the maximum open loop gain. Another problem which arises with the control loops which have been used hitherto is their restricted bandwidth which results from the box car averaging of the secondary electron signal and its subsequent comparison with a reference level. It will be evident that the control produced by such a loop is strongly dependent on the frequency of the signal at the node under examination, and in practice it is necessary to reset the adjustment of the apparatus to accommodate a change in the signal frequency. It follows that tests on an integrated circuit producing variable frequency signals cannot reliably be performed using a system of this type.

Where the frequency of the voltage at the node of the integrated circuit under test is too high to be measured in real time because of the the bandwidth limitation of the loop which may be below 1 MHz, it is possible to follow the voltage at the node by gating the electron beam or output produced by the secondary electrons in short pulses from each of which a single point of the voltage waveform is derived. This is repeated with the time of the gating varied relative to the cycle of voltage changes in the integrated circuit to produce a series of points defining the voltage waveform in the circuit after the manner of opeation of a sampling oscilloscope. This is known as the stroboscopic mode.

It is an object of the present invention to improve the performance of an electron beam testing system for integrated circuits.

According to one aspect of the present invention there is provided a method of monitoring the functioning of an integrated circuit in operation using an electron beam to bombard a selected part of an integrated circuit under test and collecting secondary electrons resulting from the bombardment using an electron detector having a biased filter grid to separate electrons having energies above a predetermined value set by the potential on the filter grid from those having energies below that value, an electrical signal representing the number of electrons passing the filter grid being compared with a steady reference signal and the difference being added to a filter bias value and fed back to set the potential on the filter grid and an output signal being produced related to the filter grid potential and representing the potential on the selected part of the integrated circuit, wherein the electrical signal is continuously compared with the reference signal to produce a difference signal which is fed back to the filter grid by a feedback path having a voltage gain to frequency characteristic with a substantially 6 dB/octave rolloff extending over substantially the entire usable band to the unity gain bandwidth.

According to a second aspect of the present invention there is provided a method of monitoring the functioning of an integrated circuit in operation using a pulsed electron beam to bombard a selected part of an integrated circuit under test and collecting secondary electrons resulting from the bombardment using an electron detector having a biased filter grid to separate electrons having energies above a predetermined value set by the potential on the filter grid from those having energies below that value, an electrical signal representing the number of electrons passing the filter grid during the pulse being compared with a steady reference signal and the difference being stored and added to a filter bias value and the sum fed back to set the potential on the filter grid and an output signal being produced related to the filter grid potential and representing the potential on the selected part of the integrated circuit during the pulse, wherein the electrical signal is compared with the reference signal during the pulse to produce a difference signal which is stored by means in a feedback path applying the stored difference signal to the filter grid, the feedback path having a voltage gain to frequency characteristic with a substantially 6 dB/octave rolloff extending over substantially the entire usable band to the unity gain bandwidth at the duty cycle of the pulsing.

Allowance should be made for the time required for signal transmission through the circuitry when performing operations on a signal derived from a beam pulse "during the pulse".

According to a third aspect of the invention there is provided apparatus for monitoring the functioning of an integrated circuit in operation in which a selected part of an integrated circuit under test is bombarded by an electron beam and the secondary electrons resulting from the bombardment are collected by an electron detector having a biased filter grid which permits secondary electrons having energies above a predetermined value set by the potential on the filter grid to pass and stops secondary electrons having energies below that value, the apparatus including means coupled to the electron detector for producing an electrical signal representing the number of electrons passing the filter grid, comparing means for comparing the electrical signal with a steady reference signal and producing an output signal proportional to the difference between them, and adding means responsive to the output signal of the comparing means for adding a filter bias value to produce the potential applied to the filter grid, the output signal of the comparing means also being used to produce an output from the apparatus representing the potential on the selected part of the integrated circuit, wherein the comparing means continuously compares the electrical signal with the reference signal and its output signal is applied to the filter grid by a feedback path having a voltage gain to frequency characteristic with a substantially 6 dB/octave rolloff extending over substantially the entire usable band to the unit gain bandwidth.

According to a fourth aspect of the invention there is provided an apparatus for monitoring the functioning of an integrated circuit in operation in which a selected part of an integrated circuit under test is bombarded by a pulsed electron beam and the secondary electrons resulting from the bombardment are collected by an electron detector having a biased filter grid which permits secondary electrons having energies above a predetermined value set by the potential on the filter grid to pass and stops secondary electrons having energies below that value, the apparatus including means coupled to the electron detector for producing an electrical signal representing the number of electrons passing the filter grid during the pulses, comparing means for comparing the electrical signal with a steady reference signal, means for storing a difference signal in response to the output signal of the comparing means and adding means responsive to the stored difference signal for adding it to a filter bias value to produce the potential applied to the filter grid, the stored difference signal also being used to produce an output from the apparatus representing the potential on the selected part of the integrated circuit, wherein the comparing means is arranged to compare the electrical signal with the reference signal during the pulse only and the storing means is in a feedback path for applying the stored difference signal to the filter grid, the feedback path having a voltage gain to frequency characteristic with a substantially 6 dB/octave rolloff extending over substantially the entire usable band to the unity gain bandwidth at the duty cycle of the pulsing.

The difference between the electrical signal and the reference signal may be produced as a current, for example from a transconductance amplifier, which is applied to charge a capacitance to a voltage which is added to the filter bias to set up the potential on the filter grid. The output signal representing the potential on the selected part of the integrated circuit may be derived from the voltage on the capacitance.

In order that the invention may be fully understood and readily carried into effect it will now be described with reference to a specific example and a modification of that example shown in the accompanying drawings of which:

Figure 1:
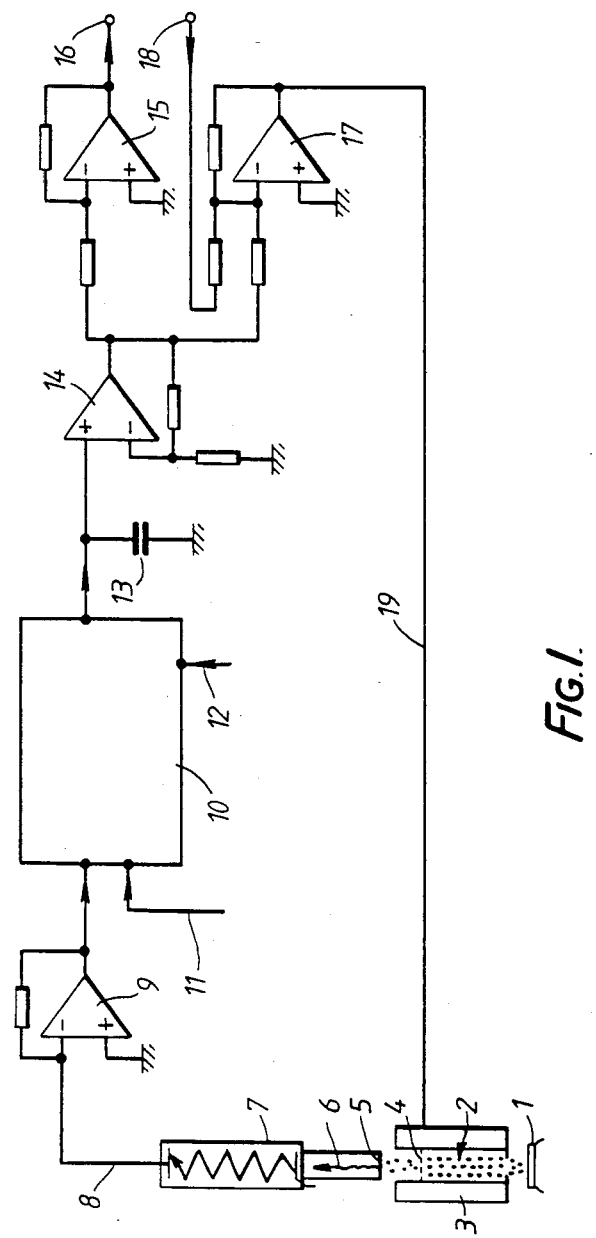
FIG. 1 shows in diagrammatic form the example of the invention.

In the apparatus shown in FIG. 1 an integrated circuit under test is placed at 1 and a selected part of it is bombarded by a beam of electrons whilst the circuit is in operation. The electron gun, the deflection system and the evacuated envelope containing them and the integrated circuit 1 are not shown since these could be of conventional construction for a system of this kind. Secondary electrons indicated by the dotted lines 2 are emitted by the integrated circuit 1 and pass upwards through an energy analyser 3 having a filter grid 4. The energy analyser 3 may have a construction as described in copending U.S. patent application Ser. No. 662,001 filed Oct. 18, 1984, now issued as U.S. Pat. No. 4,658,137 and incorporated herein by reference. The retarding field due to the voltage on the filter grid 4 allows only secondary electrons having energies greater than that corresponding to the filter grid voltage to pass. The secondary electrons passing the filter grid 4 impinge on a scintillator 5 to produce a light output represented as the photons 6. The energy analyser 3 and the scintillator 5 are also located in the evacuated envelope. A photomultiplier tube 7 receives the photons from the scintillator 5 and produces an electrical signal on conductor 8 which after amplification by a head preamplifier 9 is applied to the signal input of a transconductance amplifier 10. A reference voltage is applied via a conductor 11 to a second input of the amplifier 10. The amplifier 10 has provision for being gated by sampling pulses applied to its gate signal input 12. The output current of the amplifier 10 is applied directly to a shunt connected integrating capacitor 13 and to the input of a buffer voltage amplifier 14 having d.c. negative feedback. The output voltage of the amplifier 14 is connected to a waveform buffer amplifier 15 having resistors connected so that it acts as an inverting amplifier of fixed gain to produce a linearly amplified output on terminal 16. The amplifier 14 is also connected to a filter grid drive amplifier 17 arranged as a summing amplifier to combine the output of the amplifier 14 with a filter bias voltage applied to a terminal 18. The output of the amplifier 17 is connected to the filter grid 4 by a conductor 19.

In the operation of the apparatus shown in FIG. 1 the rate at which secondary electrons strike the scintillator 5 is maintained substantially constant by adjustment of the voltage on the filter grid 4, and a voltage corresponding to that applied to the filter grid, though differing from it by a constant (related to the filter bias applied to the terminal 18) and a factor, is produced at the terminal 16. It has been found that the voltage change required to be made to the filter grid to keep the secondary electron rate constant is substantially equal to the voltage change at the selected part of the integrated circuit under test, and therefore the output voltage on the terminal 16 can be arranged to follow quite closely the voltage on the integrated circuit. This is the real time mode of operation of the apparatus.

Figure 2:
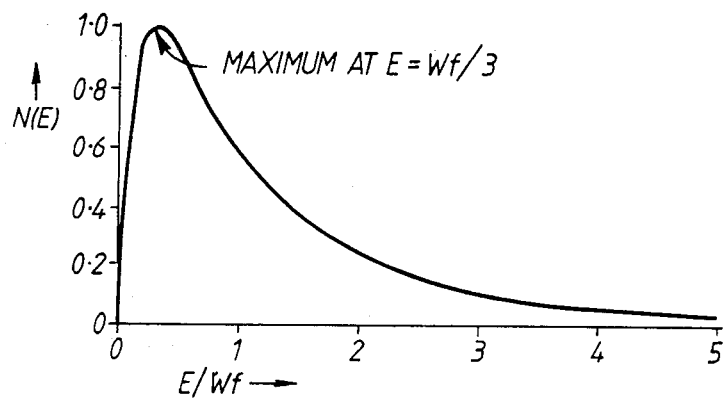
FIG. 2 shows the spectrum of secondary electron energies emitted by a target under electron bombardment.
Figure 3:
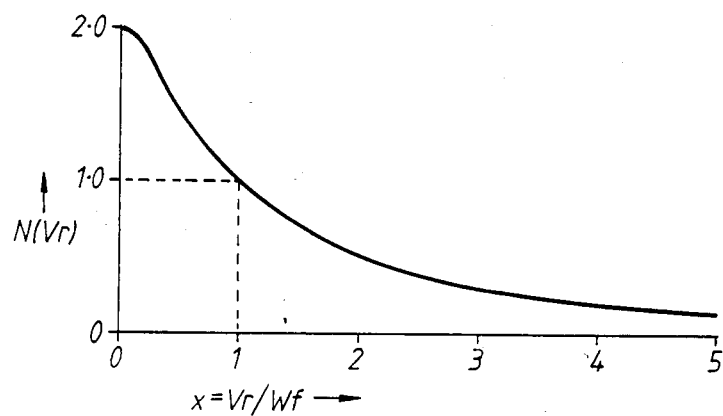
FIG. 3 is a normalized graph of the number of secondary electrons having energy greater than a given value emitted from the target under electron bombardment; this graph is referred to herein as the S-curve.

FIG. 2 is a normalised graph of the rates of emission of secondary electrons plotted against their energies emitted from an integrated circuit as a result of bombardment by a primary electron beam; the position of the entire graph on the energy scale moves with the voltage at the part of the integrated circuit being bombarded, the shape of the graph being substantially unaffected. FIG. 3 is derived from FIG. 2 and shows the numbers per unit time of secondary electrons having energies above a predetermined level, and therefore passing the filter grid, for different values of filter grid voltage. This graph is termed the S-curve after its shape, and determines the effectiveness of the loop in controlling the filter grid voltage so that the number of secondary electrons passing the filter grid is kept substantially constant.

In the stroboscopic mode, the focussed beam of electrons which is directed to the part of the integrated circuit of interest is pulsed (typically each pulse is between 0.1 and 100 ns) so that a series of samples of the voltage at that part is obtained. The sample pulses applied to the gate input 12 of transconductance amplifier 10 are produced at the same rate as the pulsing of the electron beam but are delayed relative to these pulses by the time period taken for the voltage pulse to be produced at the signal-input of the amplifier 10 in response to an electron beam pulse so that the amplifier 10 is switched off when the signal input is largely noise and is switched on when a meaningful signal input is expected. The output produced consists of many samples and the waveform of the signal at the part of the integrated circuit is built up as in a sampling oscilloscope by shifting the timing of the electron beam pulses relative to the waveform. In the stroboscipic mode the bandwidth of the loop is increased in the same proportion as the duty cycle of the beam operation is reduced because of the pulsing. It is important that the pulses should be shorter than the inverse of the bandwidth. The value of the integrating capacitance can be reduced in the same proportion as the duty cycle.

Figure 4:
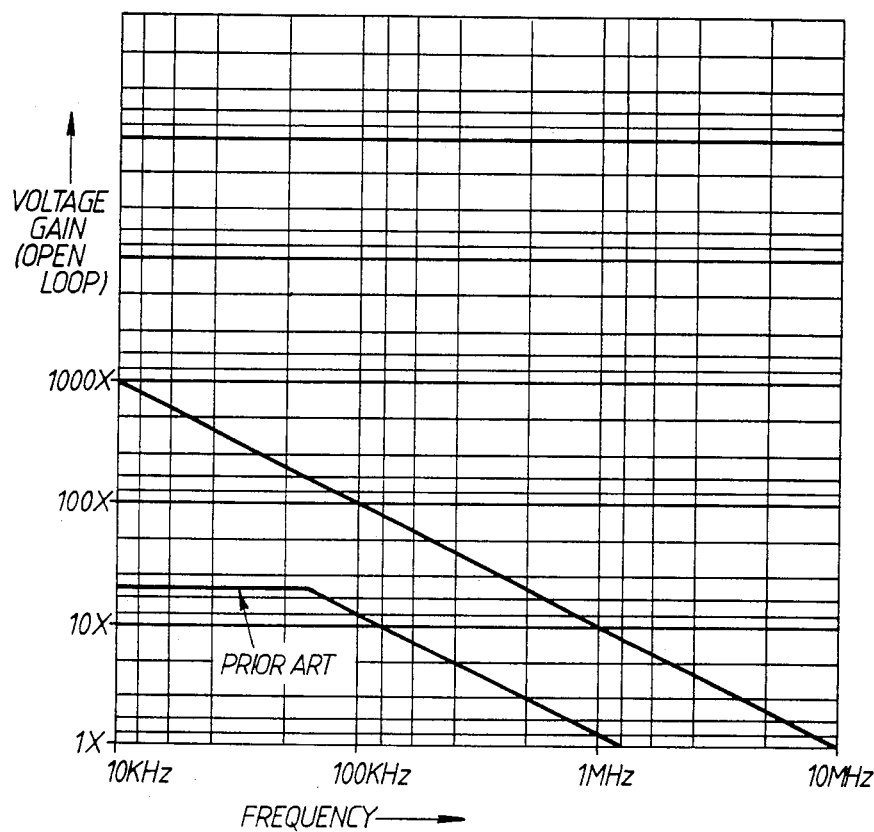
FIG. 4 shows the open loop voltage gain of the example of the invention plotted against frequency compared with the equivalent characteristic of the prior art.

The apparatus shown in FIG. 1 uses a transconductance amplifier 10; this produces a current output signal proportional to a voltage input signal which is applied to an integrating capacitor 13. This circuit configuration produces a gain/frequency characteristic for the open control loop for the filter grid voltage having a 6 dB per octave rolloff extending over the entire frequency range of signals in the loop which is the ideal for a stable, fast settling closed loop. In the prior art where voltage amplifiers are used the rolloff extends only upwards from an intermediate frequency as a result of the inherent gain limitation of the amplifier. This is shown in FIG. 4.

The unity gain bandwidth of the system shown in FIG. 1 is much higher than in the previously proposed system and can be 10 MHz or even higher due to the formation of the difference between the secondary electron signal and the reference signal before its application to the integrating capacitor. The gain of the other system components is independent of frequency to above the unity gain bandwidth of the closed loop. The integrating capacitor 13 may be of switchable value to enable the closed loop bandwidth to be reduced as necessary to optimise the filtering of shot noise in the signal derived from the secondary electrons.

Figure 5:
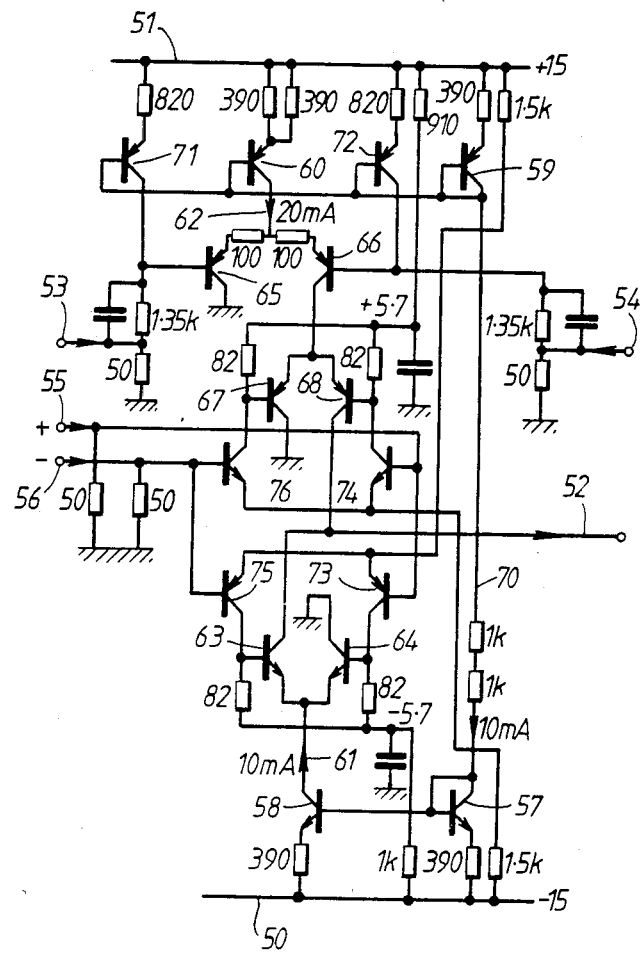
FIG. 5 is the circuit diagram of a transconductive amplifier suitable for use in the example of the invention.

FIG. 5 shows the circuit diagram of one example of the transconductance amplifier 10 suitable for construction in integrated circuit form. The amplifier is connected to a negative voltage rail 50 maintained at −15 volts and a positive voltage rail 51 maintained at +15 volts and produces at terminal 52 an output current proportional to the difference in voltage between the signal applied to the signal input 53 and the reference applied to the reference input 54. Two gate input terminals 55 and 56 are provided for a push-pull gating signal to turn the amplifier off and on. Two controlled current sources sharing a common resistor loaded current path 70 are provided respectively formed by transistors 57 and 58 and transistors 59 and 60 which feed accurately related opposite currents of 10 mA and 20 mA via conductors 61 and 62 to the transistor pairs 63 and 64 and 65 and 66. A further transistor pair 67 and 68 is connected to the collector of transistor 66. The output terminal 52 is connected to the collectors of transistors 63 and 68, and a current path exists between conductos 61 and 62 through transistors 63, 68 and 66 in series. The collectors of transistors 64, 65 and 67 are connected to ground. Transistors 57, 58 and 59 each have 390 ohm emitter resistor, but transistor 60 has two 390 ohm resistors in parallel in its emitter circuit so that the collector current of the transistor 60 is twice that of the transistor 58. The bases of transistors 65 and 66 are respectively connected to the signal and reference inputs 53 and 54 through identical resistance-capacitance networks. They also receive bias currents from transistors 71 and 72 controlled by the transistor 59. The gate input terminal 55 is connected through transistors 73 and 74 arranged as inverting buffer amplifiers to the bases of transistors 64 and 68 respectively. The gate input terminal 56 is connected through transistors 75 and 76 arranged as inverting buffer amplifiers to the bases of transistors 63 and 67 respectively.

Disregarding for the moment the function of the transistors 63, 64, 67, 68 and 73 to 76, the amplifier operates by feeding to the output terminal 52 a current equal to the difference between the current along the conductor 61 (10 mA) and that coming from the collector of transistor 66. If the signal input voltage (at terminal 53) were equal to the reference input voltage (at terminal 54) then the emitter current fed to these transistors (20 mA) via conductor would be divided equally between the collectors of the transistors 65 and 66. This would mean that the current from the collector of transistor 66 would be 10 mA and therefore equal to the current (10 mA) along the conductor 61, and no output current would flow to terminal 52. Changes in the signal input voltage at terminal 53, the reference input voltage being assumed to be kept constant, would change the proportion of current passing to the collector of the transistor 66 causing an imbalance of the currents at the output terminal 52 so that a resultant output current would flow.

The transistors 63, 64, 67 and 68 act as a two pole changeover switch controlled by the gating signal applied to the terminals 55 and 56. When the terminal 55 is sufficiently positive relative to the terminal 56 the transistors 74 and 75 are conducting and the transistors 73 and 76 are non-conducting. This means that the collector of transistor 66 and the conductor 61 are connected to the terminal 52 so that an output current depending on the signal and reference voltages is produced and the transistors 64 and 67 are non-conducting. On the other hand, if the terminal 55 were to be sufficiently negative to the terminal 56 the transistors 63 and 68 would be non-conducting so that no output current would be fed to the terminal 52 and it could adopt any voltage the external circuitry imposed on it. The currents through the conducting transistors 64 and 67 are sunk to ground.

To sum up the operation of the circuit of FIG. 5, the transistors 65 and 66 serve to steer the controlled currents from the transistor 60 so that a proportion of it dependent on the input voltage is fed to the output terminal where the difference between the proportion and the current from transistor 58 appears as the output current of the amplifier. The transistors 63, 64, 67 and 68 under the control of a push-pull gating signal applied to the terminals 55 and 56 also steer the currents either to the output terminal 52 so that an output current is produced or to ground, the output terminal 52 being allowed to float.

Although in the system shown in FIG. 1 there is a control loop setting the voltage on the filter grid in response to the number of secondary electrons passing it, the actual measurement of the waveform in the integrated circuit 1 under test as represented by the output at terminal 16 is not a closed loop measurement. Variation in the secondary electron emission coefficient of the integrated circuit 1 is just one of several factors which can influence the number of secondary electrons impinging on the scintillator 5 which can appear spuriously as changes in the waveform output at the teminal 16. Another factor which affects the system gain, that is to say the relationship between the output waveform and the waveform in the integrated circuit, is the gain of the scintillator-photomultiplier-head amplifier combination despite the fact that these components are within the filter grid voltage control loop.

I claim:

1. A method of monitoring the function of an integrated circuit in operation, using an electron beam to bombard a selected part of the integrated circuit under test to generate secondary electrons according to the potential at the site of bombardment and collecting secondary electrons resulting from the bombardment using a detector having a biased filter grid to pass electrons having energies above a predetermined value set by a bias potential on the filter grid; including the steps of:

producing an electric signal representing the number of electrons passing the filter grid and applying the electrical signal to an amplifying loop in which the electrical signal is continuously compared with a reference signal to produce a difference signal;

adding the difference signal to a filter bias signal to produce a feedback signal and applying the feedback signal as the bias potential to the filter grid over a feedback path in the amplifying loop, said amplifying loop having an open loop voltage gain to frequency characteristic with a substantially constant rolloff measured in db/octave extending over substantially the whole unity gain bandwidth of the amplifying loop; and using the difference signal to produce an output signal representing the potential present.

2. A method according to claim 1, in which the rolloff of said open loop voltage gain to frequency characteristic is substantially 6 db/octave.

3. A method according to claim 1, in which the difference signal is produced by integrating a current proportional to the difference between the electrical signal and the reference signal.

4. A method according to claim 1, in which the difference signal is produced by integrating a current proportional to the difference between the electrical signal and the reference signal, causing the rolloff of said open loop voltage gain to frequency characteristic to be substantially 6 db/octave.

5. A method of monitoring the function of an integrated circuit in operation, using an electron beam pulsed at a selected duty cycle to bombard a selected part of the integrated circuit under test to generate secondary electrons according to the potential at the site of bombardment and collecting secondary electrons resulting from the bombardment using a detector having a biased filter grid to pass electrons having energies above a predetermined value set by the bias potential on the filter grid; including the steps of:

producing an electrical signal representing the number of electrons passing the filter grid during a beam pulse and applying the electrical signal to an amplifying loop in which the electrical signal is compared with a reference signal during the beam pulse to produce a difference signal;

adding the difference signal to a filter bias signal to produce and store a feedback signal and applying the stored feedback signal as the bias potential to the filter grid over a feedback path in the amplifying loop, said amplifying loop having an open loop voltage gain to frequency characteristic with a substantially constant rolloff measured in db/octave extending over substantially the whole unity gain bandwidth of the amplifying loop at the duty cycle of the beam pulsing; and using the difference signal to produce an output signal representing the potential present.

6. A method according to claim 5, in which the rolloff of said open loop voltage gain to frequency characteristic is substantially 6 db/octave.

7. A method according to claim 5, in which the difference signal is produced by integrating a current proportional to the difference between the electrical signal and the reference signal.

8. A method according to claim 5, in which the difference signal is produced by integrating a current proportional to the difference between the elctrical signal and the reference signal, causing the rolloff of said open loop voltage gain to frequency characteristic to be substantially 6 db/octave.

9. A method according to claim 5, in which the beam pulsing has a repetition frequency related to the frequency of a recurrent waveform at a selected part of the integrated circuit under test such that beam pulsing is stepped progressively through the waveform at successive occurrences of the waveform and the output signal is processed to describe a single occurrence of the waveform.

10. Apparatus for monitoring the functioning of an integrated circuit in operation, in which a selected part of an integrated circuit under test is bombarded by an electron beam to create secondary electrons according to the potential at the site of the bombardment, said apparatus comprising:

an electron detector having a filter grid means for passing, when biased by a bias potential, secondary electrons having energies above a predetermined value set by the bias potential while stopping secondary electrons having energies below that value;

means coupled to the electron detector for producing an electrical signal representing the number of secondary electrons passing through the filter grid means;

an amplifier loop including a feedback path coupled to the filter grid means and having an open loop gain to frequency characteristic with a substantially constant rolloff measured in db/octave extending over substantially the whole unity gain bandwidth of the amplifier loop, said amplifier loop including:

comparing means for continuously comparing the electrical signal with a reference signal and producing a difference signal related to the difference between them;

adding means for adding the difference signal to a filter bias signal to provide a feedback signal over the feedback path as a bias potential to the filter grid means;

and means for producing from the difference signal an output signal representing the potential at the site of bombardment on the selected part of the integrated circuit under test.

11. Apparatus according to claim 10, wherein the comparing means includes means for producing a current proportional to the difference between the electrical signal and the reference signal, and means for integrating the current to provide said difference signal.

12. Apparatus according to claim 10, in which the rolloff of said open loop loop voltage gain to frequency characteristic is substantially 6 db/octave.

13. Apparatus for monitoring the functioning of an integrated circuit in operation, in which a selected part of an integrated circuit under test is bombarded by an electron beam pulsed at a selected duty cycle to create secondary electrons according to the potential at the site of bombardment, said apparatus comprising:

an electron detector having a filter grid means for passing, when biased by a bias potential, secondary electrons having energies above a predetermined value set by the bias potential while stopping secondary electrons having energies below that value;

means coupled to the electron detector for producing an electrical signal representing the number of electrons which pass through the filter grid means during an electron beam pulse;

an amplifier loop including a feedback path coupled to the filter grid means and having an open loop gain to frequency characteristic with a substantially constant rolloff measured in db/octave extending over substantially the whole unity gain bandwidth of the amplifier loop at the duty cycle of the electron beam pulsing, said amplifier loop including:

comparing means for comparing the electrical signal with a reference signal only during a beam pulse to produce and store a difference signal related to the difference between them;

adding means for adding the stored difference signal to a filter bias signal to provide a feedback signal over the feedback path as a bias potential to the filter grid means;

and means for producing from the stored difference signal an output signal representing the potential at the site of bombardment on the integrated circuit under test.

14. Apparatus according to claim 13, in which the pulses have a repetition frequency related to the frequency of the recurrent waveform at the selected part of the integrated circuit under test so that the pulses step progressively through the waveform at successive occurrences of it and the output signal is processed to describe a single occurrence of the waveform.

15. Apparatus according to claim 13, said comparing means for producing an output current proportional to the difference between the electrical signal and the reference signal only during each electron beam pulse, and capacitance means for receiving said output current and storing charge representing said difference signal.

16. Apparatus according to claim 15, wherein the comparing means includes a gated transconductance amplifier having a current steering circuit, and means for applying the electrical signal to the current steering circuit to control the output current from the transconductance amplifier.

17. Apparatus according to claim 13, in which the rolloff of said open loop loop voltage gain to frequency characteristic is substantially 6 db/octave.

* * * * *